US007179570B2

(12) United States Patent
Sivakumar et al.

(10) Patent No.: US 7,179,570 B2
(45) Date of Patent: *Feb. 20, 2007

(54) CHROMELESS PHASE SHIFT LITHOGRAPHY (CPL) MASKS HAVING FEATURES TO PATTERN LARGE AREA LINE/SPACE GEOMETRIES

(75) Inventors: Sam Sivakumar, Portland, OR (US); Paul Nyhus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/292,885

(22) Filed: Dec. 2, 2005

(65) Prior Publication Data

US 2006/0083998 A1 Apr. 20, 2006

Related U.S. Application Data

(62) Division of application No. 10/305,921, filed on Nov. 27, 2002, now Pat. No. 7,056,645.

(51) Int. Cl.
*G03F 1/00* (2006.01)
(52) U.S. Cl. .......................................................... 430/5
(58) Field of Classification Search ..................... 430/5
See application file for complete search history.

(56) References Cited

U.S. PATENT DOCUMENTS 5,533,634 A * 7/1996 Pan et al. ...................... 216/12
5,674,646 A * 10/1997 Kawabata et al. .............. 430/5
5,766,829 A 6/1998 Cathey, Jr. et al.
6,096,458 A 8/2000 Hibbs
6,563,566 B2 5/2003 Rosenbluth et al.
7,056,645 B2 * 6/2006 Sivakumar et al. ......... 430/311
2004/0063000 A1 * 4/2004 Maurer et al. ................. 430/5

OTHER PUBLICATIONS

Levinson, Harry J., "Principles of Lithography," 2001, SPIE—The International Society for Optical Engineering, pp. 261-263.

* cited by examiner

*Primary Examiner*—S. Rosasco
*Assistant Examiner*—John Ruggles
(74) *Attorney, Agent, or Firm*—Blakely, Sokoloff, Taylor & Zafman LLP

(57) ABSTRACT

A chromeless phase shift lithography (CPL) mask is described herein. The CPL mask includes a reticle having a phase-shifting feature pattern to produce a projected aerial image for patterning one or more large resist areas on a semiconductor substrate. The phase-shifting feature pattern includes an inner pattern comprising a plurality of phase-shifting features interspersed with non-phase-shifting areas. The phase-shifting features and the non-phase-shifting areas are arranged in a substantially alternating two-dimensional pattern surrounded by a substantially-filled phase-shifting peripheral area having a perimeter forming a pattern outline that is similar to an outline of the one or more large resist areas. Light that passes through the phase-shifting features and the phase-shifting peripheral area is phase-shifted by approximately 180 degrees from light passing through the non-phase-shifting areas of the CPL mask.

10 Claims, 9 Drawing Sheets

OPTION B

OPTION C

OPTION D

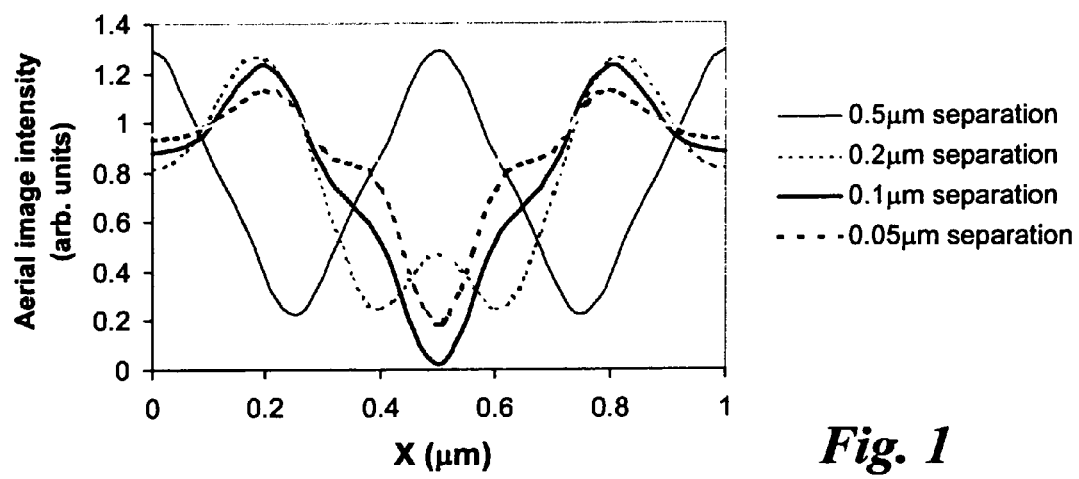
Fig. 1
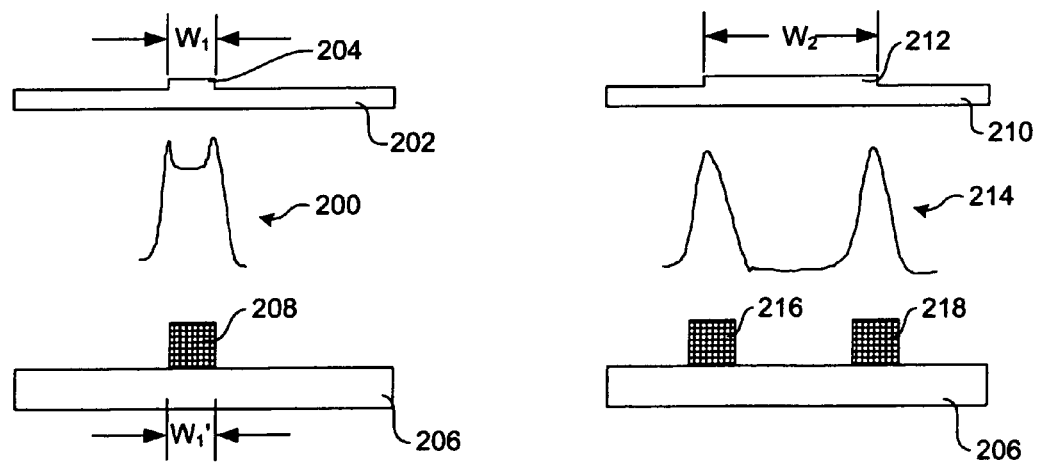
Fig. 2A          Fig. 2B

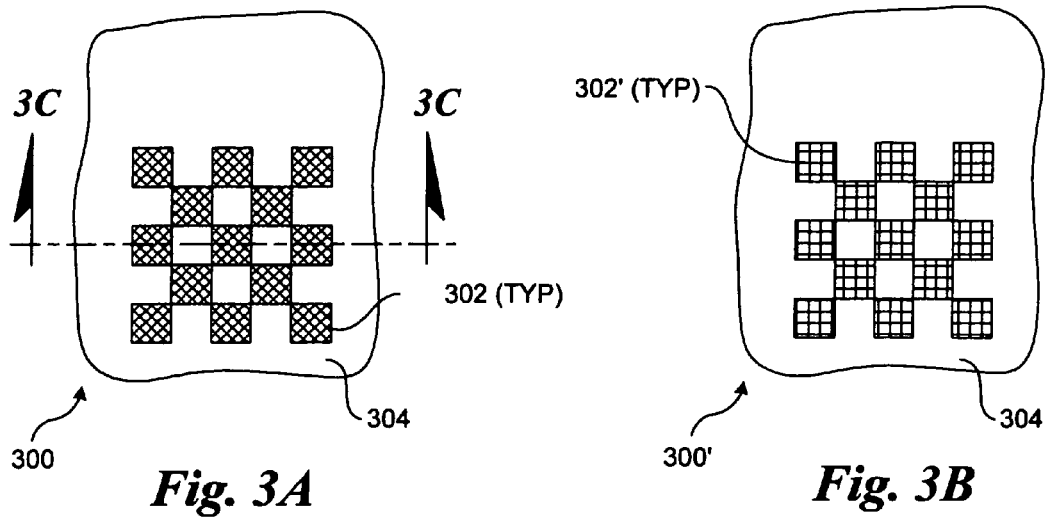
*Fig. 3A*  *Fig. 3B*
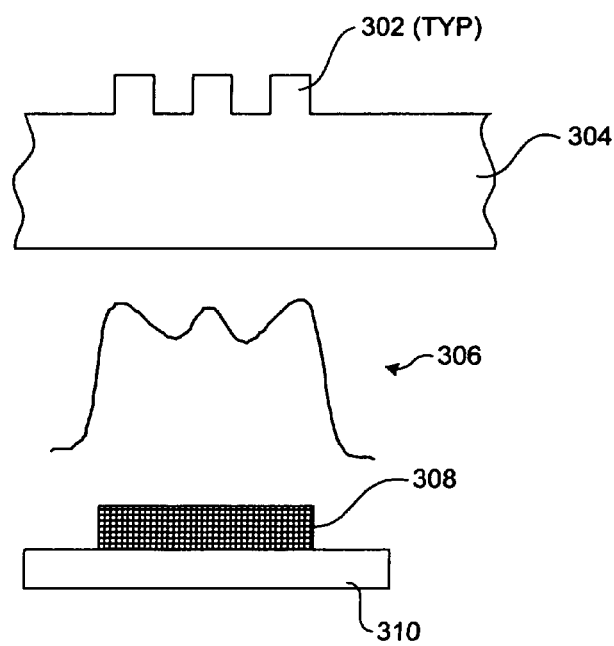
*Fig. 3C*

OPTION A

OPTION B

OPTION C

OPTION D

CHROMELESS PHASE SHIFT LITHOGRAPHY (CPL) MASKS HAVING FEATURES TO PATTERN LARGE AREA LINE/SPACE GEOMETRIES

CROSS REFERENCE TO RELATED APPLICATIONS

This application is a divisional of prior application Ser. No. 10/305,921, filed Nov. 27, 2002, now U.S. Pat. No. 7,056,645 issued Jun. 6, 2006.

FIELD OF THE INVENTION

The field of invention relates generally to semiconductors and, more specifically but not exclusively relates to a method for patterning large area line/space geometries in semiconductor substrates through the use of chromeless phase shift masks.

BACKGROUND INFORMATION

Chromeless phase shift lithography (CPL) has been investigated for many years as a possible single-mask resolution enhancement technique for lines/spaces in semiconductor devices. For positive resists, it is particularly well suited to the patterning of semi-isolated narrow lines but not to dense line/spaces or contacts. However, with significant mask design effort and added mask complexity, contacts and semi-dense line/spaces have been successfully patterned. Like other phase shifting techniques such as alternating PSM lithography, CPL can provide significantly better aerial image contrast compared to binary masks; unlike alternating PSM lithography, however, it is a single mask single exposure technique avoiding many of the dual-reticle concerns such as throughput, mask layout, and reticle to reticle overlay.

CPL uses phase edges between 0 and 180° phase shift regions on the mask to pattern lines along the phase edges. This is possible without chrome because destructive interference of light diffracted from regions immediately on either side of the phase edge result in an aerial image minimum at the wafer corresponding to the phase edge with excellent contrast if it is isolated enough. With just one phase edge defining lines, it would be impossible to pattern arbitrary layouts without a second mask to clear unwanted phase edges. CPL allows one to avoid using a second mask by patterning narrow lines with two closely spaced parallel phase edges that cannot be resolved. The combined aerial image of the two parallel phase edges is still a deep single minimum which patterns as one line but now the "line" on the reticle (mask) can be drawn just as it would with chrome, wherein the chrome is replaced by a phase shifted region. However, this only works for lines that are not wide; if the phase shifted line becomes too wide, i.e. the two phase edges of the line move too far apart, then they become individually resolvable and will pattern as two parallel lines. If the phase shifted line is too narrow, the aerial image contrast gets worse very quickly as the phase shifted region become smaller and looks more like a uniform piece of quartz. These two cliffs constrain the size of phase shift lines to a relatively tight range of small widths.

These effects are illustrated in the aerial image diagram of FIG. 1, and the schematic diagrams of FIGS. 2A and 2B. FIG. 1 corresponds to an aerial image intensity distribution simulation of a CPL reticle that is illuminated with 193 nm light using quadrupole illumination (0.1 sigma poles at 0.7 sigma radii), and projected using a 0.68 NA (numeric aperture) projection lens. The ideal case corresponds to a 0.1 μm separation, which produces a deep single minimum. As the separation width increases, the aerial image results in a pair of minimums being produced, as shown by the 0.2 μm and 0.5 μm separation curves. For example, a separation of 0.5 μm would result in two lines being resolved. This of course is undesired. As a result, wider lines are typically patterned using a binary (i.e., chrome-patterned) reticle.

The results of the foregoing phenomenon are shown schematically in FIGS. 2A and 2B. FIG. 2A depicts an aerial image 200 produced by a CPL mask 202 that includes a narrow phase-shifting feature comprising a mesa 204 having a width $W_1$. After the resist is exposed, developed, and washed, a metal layer is deposited over a substrate 206, and single line 208 is formed. The single line 208 has a width $W_1'$ that substantially matches the width $W_1$ of narrow mesa 204 (or is otherwise proportional thereto for projection systems that employ magnification). As illustrated in FIG. 2B, when short wavelength light is directed at a CPL mask 210 including a wide mesa 212 phase-shifting feature with a width $W_2$, the resulting aerial image 214 includes two narrow peaks rather than one wide peak. As a result, two narrow lines 216 and 218 are formed instead of a desired single wide line.

Under conventional practices, this wide line width/feature limitation of CPL is addressed by providing a mask that employs both CPL features and chrome features. The CPL phase shift features are used to produce narrow features, while chrome patterns are added to the CPL mask to produce large area features such as wide lines and pads on the semiconductor substrate. In this instance, the chrome is used to block light rather than phase shift the light, as is well-known in the art. One disadvantage of this approach is that the mask making process becomes more complex. Extra lithographic and etch steps in the mask making process are required to make both the chrome features and the CPL features. In addition the chrome and CPL patterns need to be precisely aligned.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 1 is a diagram illustrating an aerial image of two phase edges vs. phase edge separation for a CPL mask.

FIG. 2A is a schematic diagram illustrating an aerial image and resulting single line formed from a CPL feature having a small width;

FIG. 2B is a schematic diagram illustrating an aerial image and resulting pair of lines formed from a CPL feature having a larger width;

FIGS. 3A and 3B illustrate CPL masks for patterning large area line/space geometries, wherein the CPL mask of FIG. 3A employs a plurality of phase-shifting features comprising mesas formed over a quartz substrate, and the CPL mask of FIG. 3B employs a plurality of phase-shifting features comprising recesses formed in a quartz substrate;

FIG. 3C is a cross-section view of the CPL mask of FIG. 3A taken along section cut 3C—3C;

FIGS. 9A, 9B, and 9C respectively show various stages of post-exposure operations performed during a semiconductor manufacturing process, wherein FIG. 9A illustrates a semiconductor substrate configuration after exposed resist has been removed; and FIG. 9C illustrates the process stage after the remaining unexposed resist has been removed.

DETAILED DESCRIPTION OF PREFERRED EMBODIMENTS

Figure 4A:
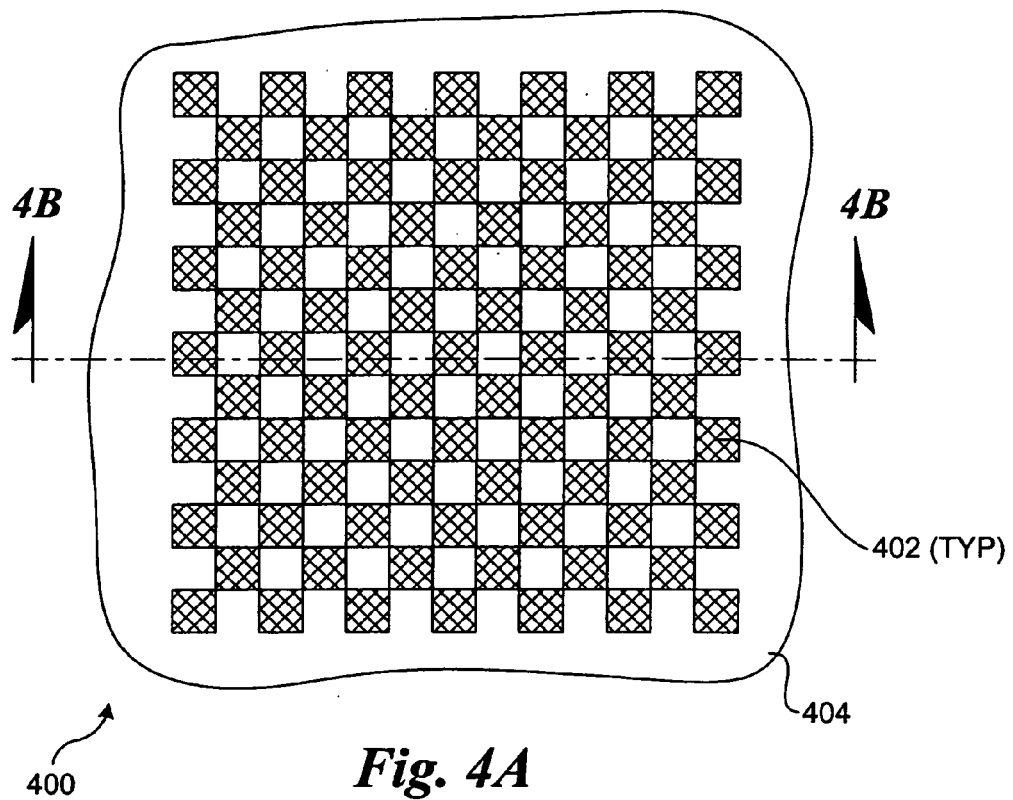
FIG. 4A is a plan view of a CPL mask pattern comprising a plurality of mesas formed on a quartz reticle and arranged in a checkerboard pattern for patterning a large pad in accordance with an embodiment of the invention.

Embodiments of methods and apparatus for patterning large area line/space geometries using chromeless phase shift techniques are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Integrated circuits (IC) are manufactured from a semiconductor substrate, such as a silicon wafer, using a series of processing steps. Generally, the various electronic elements (e.g., transistors, gates, etc.) of the IC are first formed using processing steps particular to the type of transistor being employed by the chip. For example, for CMOS (complementary metal oxide) IC's, these steps include depositing various layers, combined with various lithography steps, etching steps, and implantation steps to form the electronic elements. These electronic elements are then "integrated" via conductive (e.g., copper, aluminum, etc.) lines parallel to the substrate surface and contacts perpendicular to the surface. In addition to these metal layer features, IC's also include features such as pads and the like.

Oftentimes, the width of various features will vary. For example, a modern IC may have many lines having a base width corresponding to the limitation of the photolithography technology (e.g., 0.25 microns), while other lines and features such as pads have a width that is several multiples of the base line width. As discussed above, under conventional techniques, the narrow base lines may be patterned using phase-shifting features on a CPL mask, while the larger line width and area features are patterned using corresponding chrome features on the reticle. This use of the two different mask technologies is required due to the limitation of conventional CPL techniques for patterning large line width and feature areas, as exemplified in FIGS. 1 and 2B above.

In accordance with aspects of the invention, the conventional CPL large pattern area/line width limitation may be overcome by patterning a CPL mask with a plurality of phase shifting features interspersed with non-phase-shifting areas of the mask and arranged in a substantially alternating two-dimensional pattern. In general, the phase-shifting features may comprise recesses or mesas, which are formed in a quartz substrate via a suitable manufacturing process (e.g., via etching). For example, CPL masks 300 and 300' in FIGS. 3A and 3B illustrate CPL masks suitable for patterning a target area on a substrate having a shape substantially corresponding to the overall perimeter area occupied by the phase-shifting feature (mesa or recess) pattern on the mask. In one embodiment, CPL mask 300 includes a plurality of mesas 302 extending upward from a quartz substrate 304. Optionally, a plurality of recesses 302' may be used in place of the mesas, as depicted by CPL mask 300' in FIG. 3B. Generally, the height of the mesas (or depth of the recesses) is selected such that light impinging on the mesa (or recess) areas will have a phase shift of 180° relative to light passing through the mask in areas unoccupied by the mesas (or recesses), which comprise non-phase-shifting areas of the mask.

If the phase-shifting features are small enough and close enough, the corresponding composite aerial image produced by projecting the phase-shifted light and the non-phase-shifted light will merge to provide sufficient exposure to pattern a large area in a resist layer. For example, the result of the phase shift effect caused by the phase-shifting features of CPL mask 300 produces a composite aerial image 306 (after projection) shown in FIG. 3C. This aerial image intensity distribution may then be used to pattern a wide line area 308 on a target area of a semiconductor substrate 310.

Figure 4B:
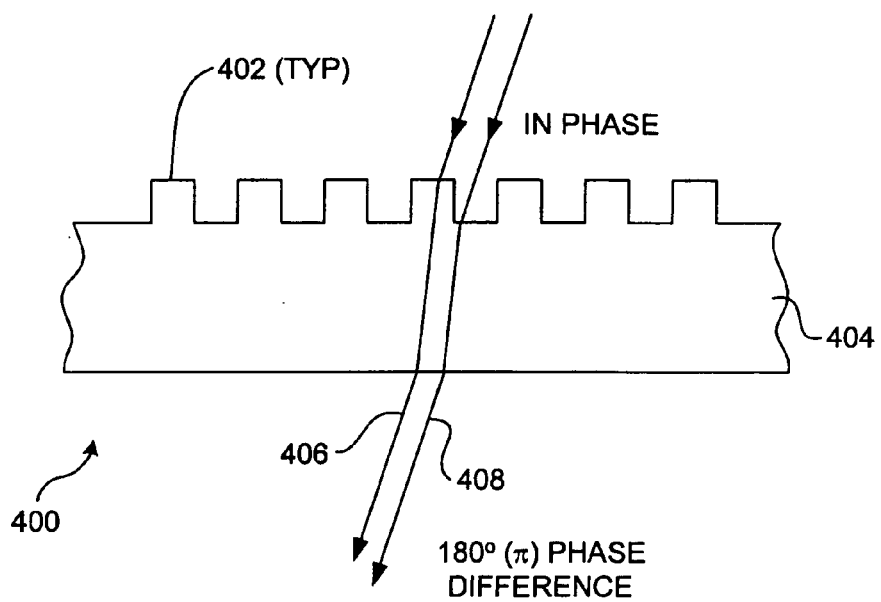
FIG. 4B illustrates a cross-section view of the CPL mask of FIG. 4A, taken along section cut 4B—4B.
Figure 5A:
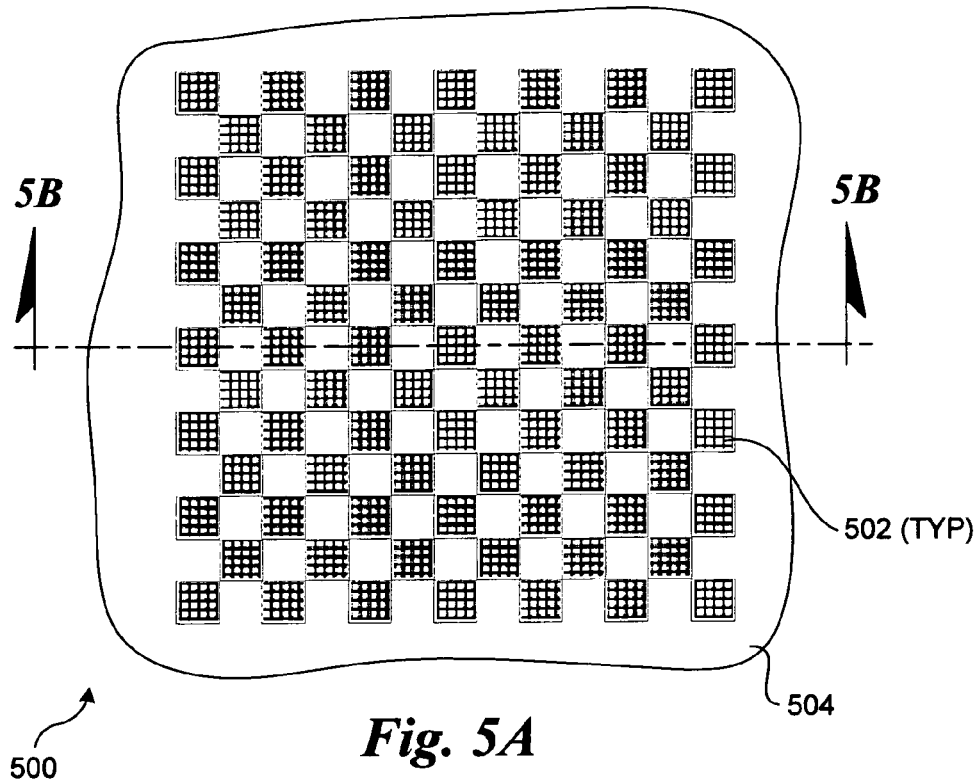
FIG. 5A is a plan view of a CPL mask pattern comprising a plurality of recesses formed in a quartz reticle and arranged in a checkerboard pattern for patterning a large pad in accordance with an embodiment of the invention.
Figure 5B:
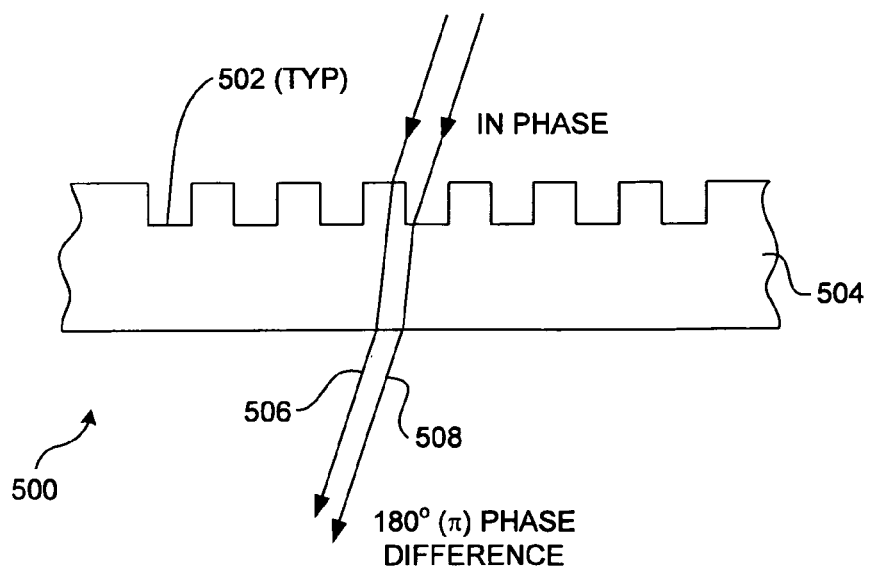
FIG. 5B illustrates a cross-section view of the CPL mask of FIG. 5A, taken along section cut 5B—5B.

Plan views of phase-shifting feature patterns for patterning larger exemplary geometries are shown in FIGS. 4A and 5A. FIG. 4A depicts a CPL mask 400 comprising a plurality of mesas 402 extending upward from a quartz reticle 404. As shown in FIG. 4B, as light ray 406 passes through a phase-shifting mesa, it is shifted in phase approximately 180° relative to a light ray 408 that passes through a non-phase-shifting area of reticle 404. A similar phase-shift effect may be produced by a recessed feature in a reticle. For example, shown by the in the FIG. 5B cross-section view of the CPL mask 500 of FIG. 5A, a light ray 508 passing through a recess 502 formed in a reticle 504 is shifted in phase 180° relative to a light ray 506 passing through a non-phase-shifting area of reticle 504.

Optionally base patterning configurations are shown in FIGS. 6A–6D. The option A pattern of FIG. 6A comprises a plurality of squares 600 configured in a rectangular array. In option B, the area corresponding to all of the outside squares in the checkerboard area comprises a phase-shifting feature. Option C is similar to option B, except that the center square 602 along each edge now corresponds to a non-phase-shifting area. Finally, option D comprises a sort of "bull's eye" configuration, wherein a single square 604 is formed within a phase shifted closed perimeter 606 separated by a non-phase-shifted area 608.

Although illustrated in the foregoing examples as squares, various other shapes may be employed, such as rectangles, diamonds, etc. Generally, the shape of the phase-shifting features can take any shape as long as they are physically small enough and placed close enough together to ensure that the aerial images of the features merge to provide a combined aerial image capable of patterning the area as a large resist structure. Additionally, the size of the shapes employed should be selected such that the critical dimension (which will generally be the longest dimension) of the shape ensures that the desired substrate pattern is obtained. For example, the length of a rectangular element should be less than a feature length that causes multiple lines to be patterned. Generally, the selected shape should be configured so as to produce a two dimensional pattern having alternating phase-shifting features interspersed with non-phase-shifting areas of the reticle. In FIGS. 3A, 3B, and 6A–D, these non-phase-shifting areas are depicted by the white space between the cross-hatched areas, which represent the phase-shifting features.

Figure 7A:
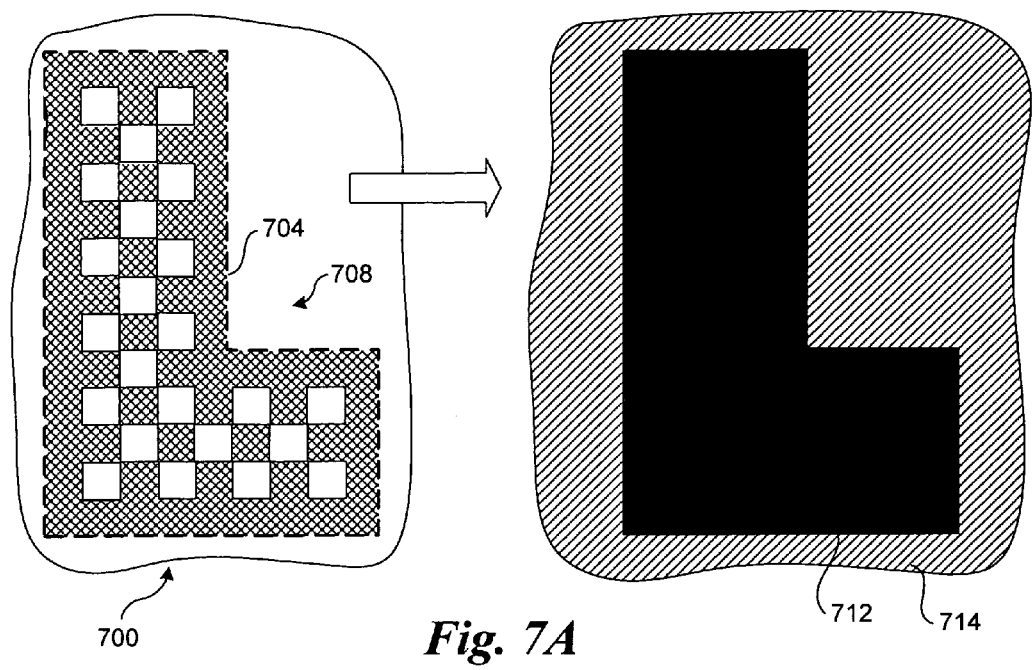
FIGS. 7A and 7B illustrate various feature shapes that may be patterned using the phase-shift pattern configurations illustrated in FIGS. 6B and 3A, respectively.
Figure 7B:
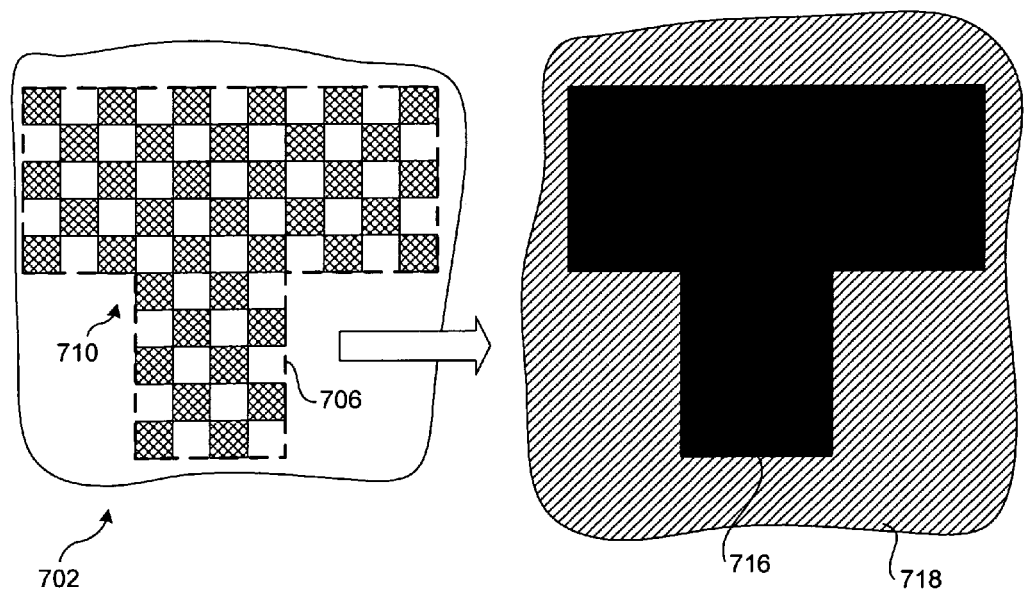

In general, a base patterning configuration can be extended to pattern shapes of various target configurations. For example, phase shifting patterns for patterning an "L"-shaped feature and a "T"-shaped feature are respectively illustrated by CPL mask 700 and 702 of FIGS. 7A and 7B. The perimeter (i.e., outline) of the target large resist area will generally map to a corresponding perimeter drawn around the general area occupied by phase-shifting features on the mask (corresponding to a particular target feature), as shown by the dashed-line perimeters 704 and 706 drawn around phase-shifting feature patterns 708 and 710 in FIGS. 7A and 7B, respectively. As a result, through use of appropriate illumination and projection components (such as described below), phase-shifting feature pattern 708 of CPL mask 700 can be used to expose an "L"-shaped resist area 712 on a resist layer 714 shown in FIG. 7A. Similarly, phase-shifting feature pattern 710 can be used to expose a "T"-shaped resist area 716 on a resist layer 718 shown in FIG. 7B.

Figure 8:
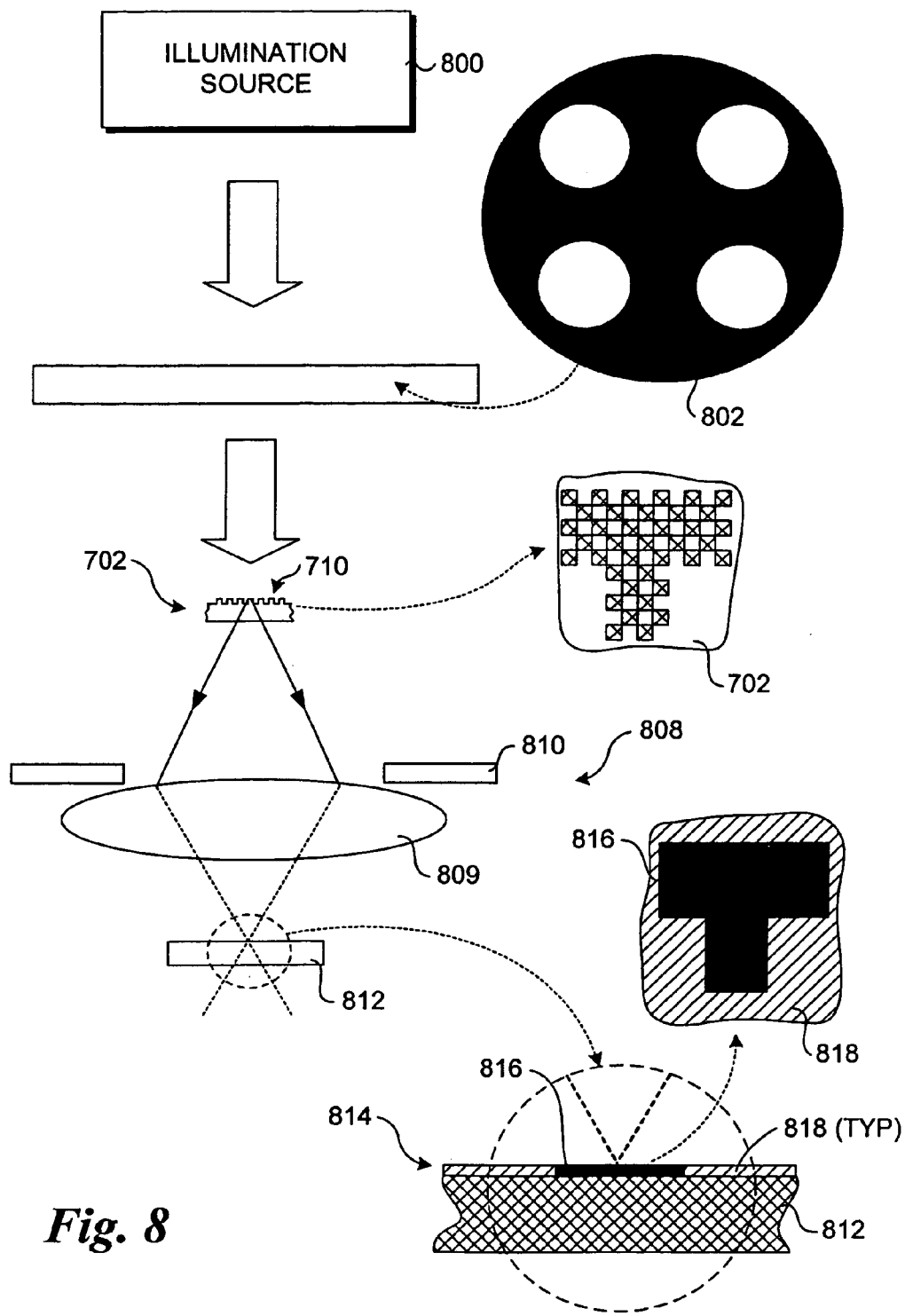
FIG. 8 is a schematic diagram illustrating an exemplary photolithography process in which a CPL mask corresponding to the teachings of the invention may be employed to pattern large area line/space geometries.

A lithography process corresponding to an exemplary implementation of a CPL mask in accordance with aspects of the invention is shown in FIG. 8. The process is performed using a lithography apparatus (i.e., stepper) that employs a short wavelength illumination source 800 to emit light at a wavelength appropriate for the process (e.g., 248 nm, 193, or 157 nm). In general, such an illumination source will be used to illuminate a reticle having phase-shifting features formed thereon. These illumination sources may include on-axis illumination sources and off-axis illumination sources such as annular, dipole, quadrupole, and quasar light sources. Generally, off-axis illumination, in combination with CPL, enables the patterning of finer features for a given set of optical parameters (e.g., $\lambda$, $k_1$, and NA). For example, in FIG. 8, the light produced by illumination source 800 is redirected by optical element 802 to produce a quadrupole light source. In this case, the quadrupole poles are positioned off the optical axis of the lithography apparatus in such a way that most of the light from these sources impinges on the reticle of CPL mask 702 at an acute angle with little light impinging perpendicular to the reticle.

As discussed above, light impinging on the phase-shifting features (in this case mesas corresponding to phase-shifting feature pattern 710) on the reticle is shifted 180° in phase when it passes through the reticle. Meanwhile, light impinging on non-phase-shifting areas of the reticle (i.e., the "white" space around and interspersed between the cross-hatched phase-shifting features of CPL mask 702) passes through the reticle without a phase shift. Both the phase-shifted and non-phase-shifted light then is passed through a projection system 808, depicted as a lens 809 disposed behind an aperture 810 for simplicity; in practice, the projection system may typically employ other optical components that are not shown. The projection system is used to focus the light toward a focal area in which a semiconductor substrate 812 coated with layer 814 (e.g., via spin coating) of resist is placed, as further shown in the blown-up detail of FIG. 8. This produces an aerial image intensity distribution that comprises the composite of the aerial image intensity distributions for the individual phase-shifting features and non-phase-shifting features.

Some portions 816 of the resist 814 (indicated by the densely cross-hatched areas) are exposed to higher intensity light rays corresponding to the composite aerial image, while other portions 818 (indicated by the lightly cross-hatched areas) are not, based on the phase-shifting feature pattern formed on CPL mask 702, in combination with various optical considerations, such as numeric aperture (NA), the wavelength $\lambda$ of the light, the amount of offset, the arrangement of the optical components, etc.

Figure 9A:
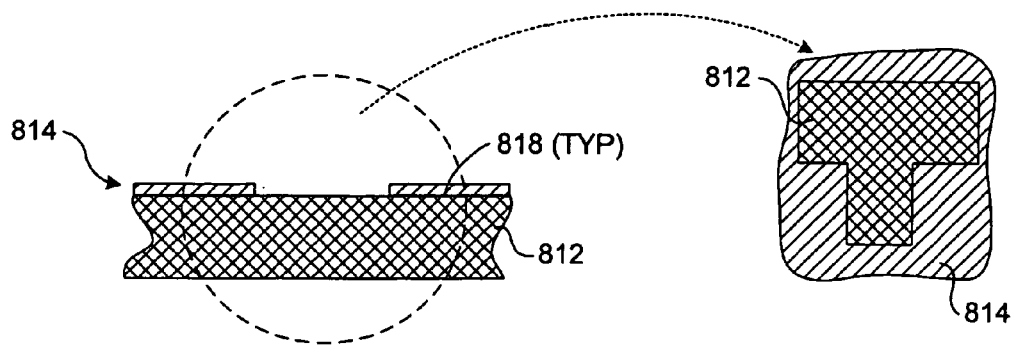
Figure 9B:
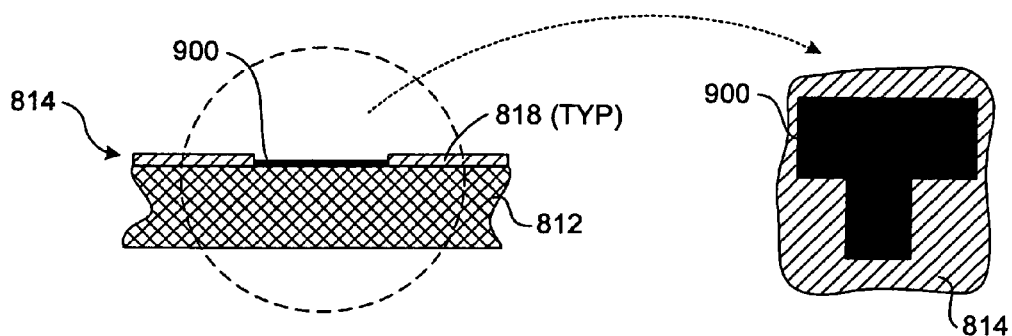
Figure 9C:
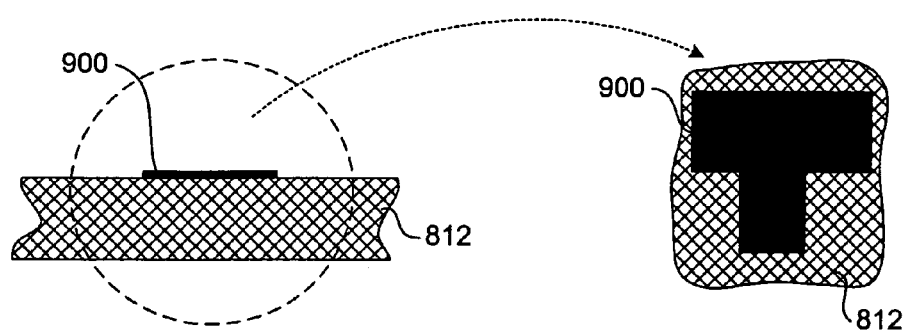

After the resist has been exposed, one or more processing steps are performed to develop away the exposed resist while leaving the unexposed areas of the resist. In accordance with positive tone resist characteristics, exposure of the resist with sufficient light intensity causes a chemical change that makes it soluble in developer fluid. The resist so exposed is developed away by dissolving in an appropriate solvent. The results of this process are shown in FIG. 9A. Next, a metal deposition operation is performed to deposit a layer of metal 900 on the surface of semiconductor substrate 812 in areas from which the resist has been removed. The end result of this operation is depicted in FIG. 9B. Finally, the unexposed portion 818 of the resist is removed using an appropriate chemical process, leaving the substrate appearing as shown in FIG. 9C. Thus, the foregoing process enables a large area geometry to be patterned in a resist layer by means of a CPL mask, and, subsequently, a corresponding metal layer feature having a configuration defined by the resist layer pattern is then deposited onto the semiconductor substrate to form the large area feature.

Simulated Results

Figure 6A:
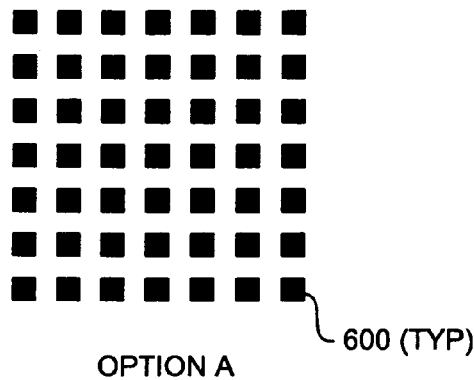
FIGS. 6A, 6B, 6C, and 6D illustrate various optional phase-shifted pattern configurations suitable for patterning large area line/space geometries.
Figure 6B:
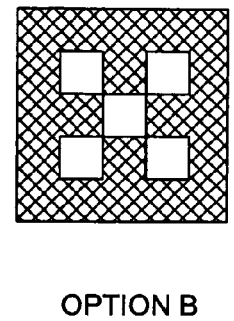
Figure 6C:
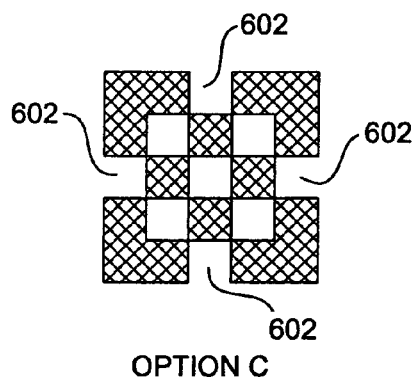
Figure 6D:
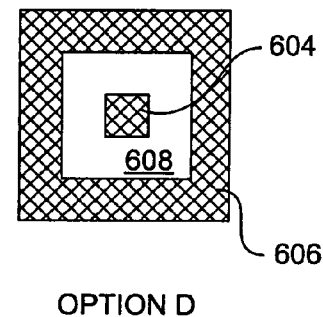
Figure 10:
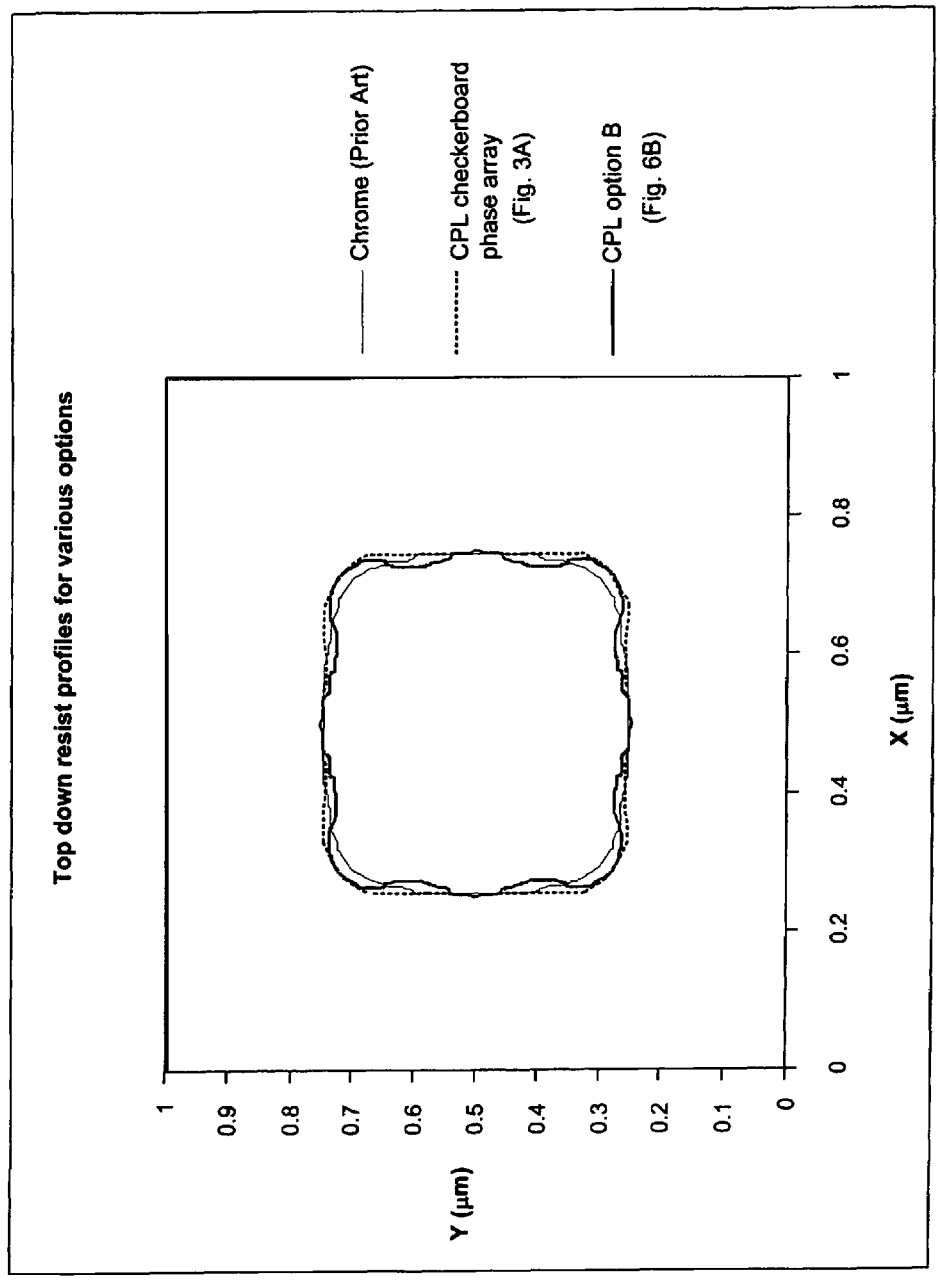
FIG. 10 is a diagram illustrating resist profiles produced by a conventional chrome mask feature technique and CPL techniques in accordance with embodiments of the invention.

FIG. 10 contains a graphic comparing the patterning results of a conventional chrome mask, the CPL mask configured in the checkerboard phase array pattern of FIG. 3A, and a CPL mask configured in a pattern corresponding to option B illustrated in FIG. 6B. As can be readily observed, both of these CPL mask options produce a resist pattern that is similar to that produced using the conventional chrome patterning technique. As a result, a CPL mask in accordance with the teachings disclosed herein may be made to pattern both fine line width and fine pitch features in combination with larger line width features and areas, such as pads, without requiring the use of chrome in the mask.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A chromeless phase shift lithography (CPL) mask comprising:
   a reticle having a phase-shifting feature pattern to produce a projected aerial image for patterning one or more large resist areas on a semiconductor substrate, the phase-shifting feature pattern including an inner pattern comprising a plurality of phase-shifting features interspersed with non-phase-shifting areas and arranged in a substantially alternating two-dimensional pattern surrounded by an at least substantially-filled phase-shifting peripheral area having a perimeter forming a pattern outline that is similar to an outline of the one or more large resist areas, wherein light passing through the phase-shifting features and the phase-shifting peripheral area is phase-shifted by approximately 180 degrees from light passing through the non-phase-shifting areas of the CPL mask.

2. The CPL mask of claim 1, wherein the plurality of phase-shifting features are arranged in a base pattern comprising a checkerboard pattern.

3. The CPL mask of claim 1, wherein the phase-shifting feature pattern includes a phase-shifting inner area comprising an island, surrounded by a non-phase shifting area, which in turn is surrounded by a phase-shifting peripheral area.

4. The CPL mask of claim 1, wherein the plurality of phase-shifting features are arranged in a rectangular array.

5. The CPL mask of claim 1, wherein at least one of said one or more large resist areas is non-rectangular.

6. The CPL mask of claim 1, wherein the plurality of phase-shifting features comprise a plurality of recesses formed in the reticle.

7. The CPL mask of claim 1, wherein the plurality of phase-shifting features comprise a plurality of mesas extending upward from the reticle.

8. The CPL mask of claim 1, wherein the reticle comprises a quartz substrate.

9. The CPL mask of claim 1, wherein the plurality of phase-shifting features are substantially square in shape.

10. The CPL mask of claim 1, wherein the plurality of phase-shifting features are arranged in a pattern occupying a peripheral area having a shape defined by a polygon having at least six sides.

* * * * *